United States Patent
Cannon et al.

(10) Patent No.: US 10,696,080 B1
(45) Date of Patent: Jun. 30, 2020

(54) METHOD AND STAMP FOR REPEATABLE IMAGE CORRELATION MICRO PATTERNING AND RESULTING SPECIMEN PRODUCED THEREFROM

(71) Applicants: 1900 LLC, Clemson, SC (US); UNITED STATES OF AMERICA AS REPRESENTED BY THE ADMINISTRATOR OF NASA, Washington, DC (US)

(72) Inventors: Andrew H Cannon, Anderson, SC (US); March C Maguire, Clemson, SC (US); Jacob D Hochhalter, Hampton, VA (US)

(73) Assignee: 1900 LLC, Clemson, SC (US)

( * ) Notice: Subject to any disclaimer, the term of this patent is extended or adjusted under 35 U.S.C. 154(b) by 153 days.

(21) Appl. No.: 15/044,749

(22) Filed: Feb. 16, 2016

Related U.S. Application Data

(60) Provisional application No. 62/116,742, filed on Feb. 16, 2015.

(51) Int. Cl.
| | | |
|---|---|---|
| *B41N 1/00* | (2006.01) | |
| *B41C 1/06* | (2006.01) | |
| *G03F 7/00* | (2006.01) | |

(52) U.S. Cl.
CPC .............. *B41N 1/00* (2013.01); *B41C 1/06* (2013.01); *G03F 7/0017* (2013.01)

(58) Field of Classification Search
None
See application file for complete search history.

(56) References Cited

U.S. PATENT DOCUMENTS

| | | |
|---|---|---|
| 5,735,985 A | 4/1998 | Ghosh et al. |
| 7,237,337 B2 | 7/2007 | Yeh et al. |
| 7,410,606 B2 | 8/2008 | Appleby et al. |
| 2006/0162896 A1 | 7/2006 | Schmitz et al. |

OTHER PUBLICATIONS

Xia et al., "Soft Lithogrphy" Snnu. Rev. Mater. Sci. 1998. 28: 153-184.*

Two-dimensional digital image correlation for in-plane displacement and strain measurement: a review; Bing Pan, Kemao Qian, Huimun Xie, Anand Asundi; IOP Publishing (2009).

Surface Decoration for Improving the Accuracy of Displacement Measurements by Digital Image Correlation in SEM; B. Winiarski, G. S. Schajer, P. J. Withers—Experimental Mechanics (2012).

The Art and Application of DIC; Phillip Reu; Experimental Techniques (2015).

(Continued)

*Primary Examiner* — Joshua D Zimmerman
(74) *Attorney, Agent, or Firm* — Parker Poe Adams & Bernstein, LLP

(57) ABSTRACT

A method and surface micro patterned stamp for patterning image correlation test specimens is disclosed. The stamp may be formed and applied to the surface of structural components and laboratory test specimens in a repeatable fashion while reducing requisite infrastructure and time. The resulting test specimen incorporating the surface micro stamped pattern is also disclosed.

28 Claims, 5 Drawing Sheets

(56) References Cited

OTHER PUBLICATIONS

Development of patterns for nanoscale strain measurements: I. Fabrication of imprinted Au webs for polymeric materials; S.A. Collette, M.A. Sutton, P. Miney, A.P. Reynolds, Xiaodong Li, P.E. Colavita, W.A. Scrivens, Y Luo, T Sudarshan, P. Muzykov, M.L. Myrick; IOP Publishing Ltd. (2004).
Digital Image Correlation of Heterogeneous Deformations in Polycrystalline Material With Electron Backscatter Diffraction—Thesis by Javier Esquivel; Purdue University—Dec. 2014.
Small-scale patterning methods for digital image correlation under scanning electron microscopy; A D Kammers, S Daly; Measurement of Science and Technology (2011).

\* cited by examiner

METHOD AND STAMP FOR REPEATABLE IMAGE CORRELATION MICRO PATTERNING AND RESULTING SPECIMEN PRODUCED THEREFROM

CROSS REFERENCE TO RELATED APPLICATION

This application claims the benefit of U.S. Provisional Patent Application No. 62/116,742, filed on Feb. 16, 2015, which is hereby incorporated by reference in its entirety.

STATEMENT REGARDING FEDERALLY SPONSORED RESEARCH OR DEVELOPMENT

The invention described herein was made in part by an employee of the United States Government and may be manufactured and used by or for the Government of the United States of America for governmental purposes without the payment of any royalties thereon or therefore.

BACKGROUND OF THE INVENTION

This invention relates generally to an inventive method of molding and/or casting microstructured objects. More particularly, the present invention relates to a micro pattern stamping method and device for measuring surface strain and the specimen resulting therefrom. Further, the present invention relates to a high throughput, high-resolution, low cost, parallel patterning method in which a stamp surface pattern is replicated into a material by mechanical contact and three dimensional material displacement or transfer printing.

Object replication may be performed using basic casting and molding methods, which include forming a mold on or around a master object to create a negative of the object and then filling the mold with a material to create a replica that generally resembles the outer-dimensions of the master object. Alternatively, the mold may be pressed onto a material to replicate the pressed features of the master object on the end product. Furthermore, the negative of the desired end product may be fabricated directly and then used in a casting, molding or stamping process.

Recent casting and molding methods are set forth in U.S. Patent Application Publication No. 2006/0162896 and U.S. Pat. Nos. 5,735,985; 7,237,337; and 7,410,606.

To date, electron beam lithography and photo lithography methods are the only available methods that provide repeatability in an applied pattern of a microstructure. Electron beam lithography is limited to electron beam resist materials, which are not optically opaque and consequently have low optical contrast, Another limitation of electron beam lithography is that the surface to be patterned must be planar; thereby further limiting the application of the electron beam lithography since it cannot be readily applied to surfaces with significant curvature. Further, to achieve sufficient surface smoothness for electron beam lithography application, additional surface polishing and preparation is required. Thus, the steps involved in applying surface patterns using electron beam lithography are prohibitive.

There is a need in the art for a high-throughput micropattering method that is capable of supporting a high volume of testing. There is also a need in the art for a method of applying surface patterns for image correlation on realistic (non-planar) surfaces.

SUMMARY OF THE INVENTION

An innovative method has been developed and tested whereby repeatable patterns for image correlation can be applied without the need for dedicated technical staff or special infrastructure, and may often be completed in a few minutes rather than days. Furthermore, the methods of the present invention are often more amenable to application of patterns to complex surface geometries and larger surface areas. The methods of the present invention preferably allow for higher contrast patterning materials to be used, which typically improves the accuracy of strain measurements using image correlation.

The present invention includes a method whereby patterns may be applied to the surface of structural components and laboratory test specimens in a repeatable fashion via physical stamps while reducing requisite infrastructure and time. The invention also preferably enables external collaborations since a standardized pattern may be used throughout the research community.

In one embodiment of the present invention, the method of patterning image correlation specimens includes the steps of providing a surface micro patterned stamp having a designated pattern thereon, wherein the designated pattern includes microfeatures, and providing a specimen. The method further includes the steps of depositing a patterning material onto the specimen, engaging the surface micro patterned stamp with the specimen so that the patterning material replicates the designated pattern on the specimen, and removing the surface micro patterned stamp from the specimen. Further, the patterning material is allowed to cure to form an image correlation specimen.

The method of the present invention may further include the step of measuring surface strain of the image correlation specimen. In an embodiment of the present invention, the method may include the step of depositing the patterning material onto the surface micro patterned stamp prior to engaging the surface micro patterned stamp with the specimen. In an embodiment of the present invention, the method may include the step of depositing the patterning material onto the surface micro patterned stamp prior to depositing the patterning material onto the specimen. In an embodiment of the present invention, the method may include the step of applying an alternate patterning material to the specimen after the first patterning material has cured. In one embodiment, the alternate patterning material is a distinct color from the original patterning material. In an embodiment of the present invention, the method may include the step of fabricating the surface micro patterned stamp, such as by casting or molding the surface micro patterned stamp from a stamp master. In an embodiment of the present invention, the method may include the step of patterning electron beam resist on a prototype using electron beam lithography to fabricate the stamp master.

In an embodiment of the present invention, the surface micro patterned stamp is flexible. Alternatively, the surface micro patterned stamp may be rigid. In an embodiment of the present invention, the surface micro patterned stamp may be composed of polymer material, such as silicone rubber, styrenic block copolymer (SBC) rubber, ethylene propylene diene monomer (EPDM) rubber, and/or urethane rubber. In an embodiment of the present invention, the surface micro patterned stamp is a roller shaped stamp. In an embodiment of the present invention, the specimen may be curved or flat. In an embodiment of the present invention, the patterning material may be opaque or transparent. In an embodiment of the present invention, the patterning material may be ink, such as photoresist, electron beam resist, paint, and dye.

In another embodiment of the present invention, the method of patterning image correlation specimens includes the steps of providing a substrate, patterning a resist on the substrate, such as by using electron beam lithography or photolithography, to create a template having a designated pattern having microfeatures on the template, and casting a microstructured stamp from the template, wherein the microstructured stamp includes a negative of the designated pattern having microfeatures. Further, the method may include the steps of providing a specimen, depositing pattern material onto the specimen, engaging the microstructured stamp with the specimen so that the pattern material forms the designated pattern having microfeatures on the specimen, curing the pattern material onto the specimen to form a test specimen suitable for image correlation testing, and removing the microstructured stamp from the specimen.

The method may further include the step of treating the microstructured stamp with an oxygen plasma. The method may also include the step of depositing the pattern material on the microstructured stamp prior to depositing the pattern material onto the specimen. In an embodiment of the present invention, the pattern material may be opaque and the designated pattern having microfeatures formed on the specimen is an opaque micro pattern. In an embodiment of the present invention, the stamp may be composed of rubber such as silicone rubber. In an embodiment of the present invention, the substrate may be an aluminum prototype. In another embodiment, the substrate may be a silicon prototype.

In yet another embodiment of the present invention, the method of patterning image correlation specimens includes the steps of providing a substrate, patterning a resist on the substrate to create a template having a designated pattern having microfeatures on the template, casting a silicone rubber from the template, wherein the silicone rubber includes a negative of the designated pattern having microfeatures, and casting a urethane rubber from the silicone rubber, wherein the urethane rubber comprises the designated pattern having microfeatures. Further, the method may include the steps of applying pattern material onto the urethane rubber, providing a specimen, engaging the urethane rubber with the specimen so that the pattern material contacts the specimen, curing the pattern material onto the specimen to form a test specimen suitable for image correlation testing, and removing the microstructured stamp from the specimen.

In an embodiment of the present invention, the pattern material is opaque and the designated pattern having microfeatures formed on the specimen is an opaque micro pattern. In an embodiment of the present invention, the resist is electron beam resist, which is patterned on the substrate using electron beam lithography to create a template having a designated pattern having microfeatures on the template. In alternative embodiment, the resist is photoresist, which is patterned on the substrate using photolithography to create a template having a designated pattern having microfeatures on the template.

In another embodiment, the patterning material is semi-transparent to electrons, which allows the use of electron backscatter diffraction (EBSD) techniques. Because the patterning material can be semi-transparent, digital image correlation can be performed on the patterned area, and EBSD and digital image correlation techniques may be performed on the same area.

The present invention also includes a surface micro patterned stamp for image correlation testing. The surface micro patterned stamp may include a flexible rubber face having microfeatures extending therefrom. Further, patterning material may adhere to the microfeatures for transferring the patterning material to a specimen.

Moreover, the present invention also includes specimens made according to the teachings herein.

BRIEF DESCRIPTION OF THE DRAWINGS

Figure 1:
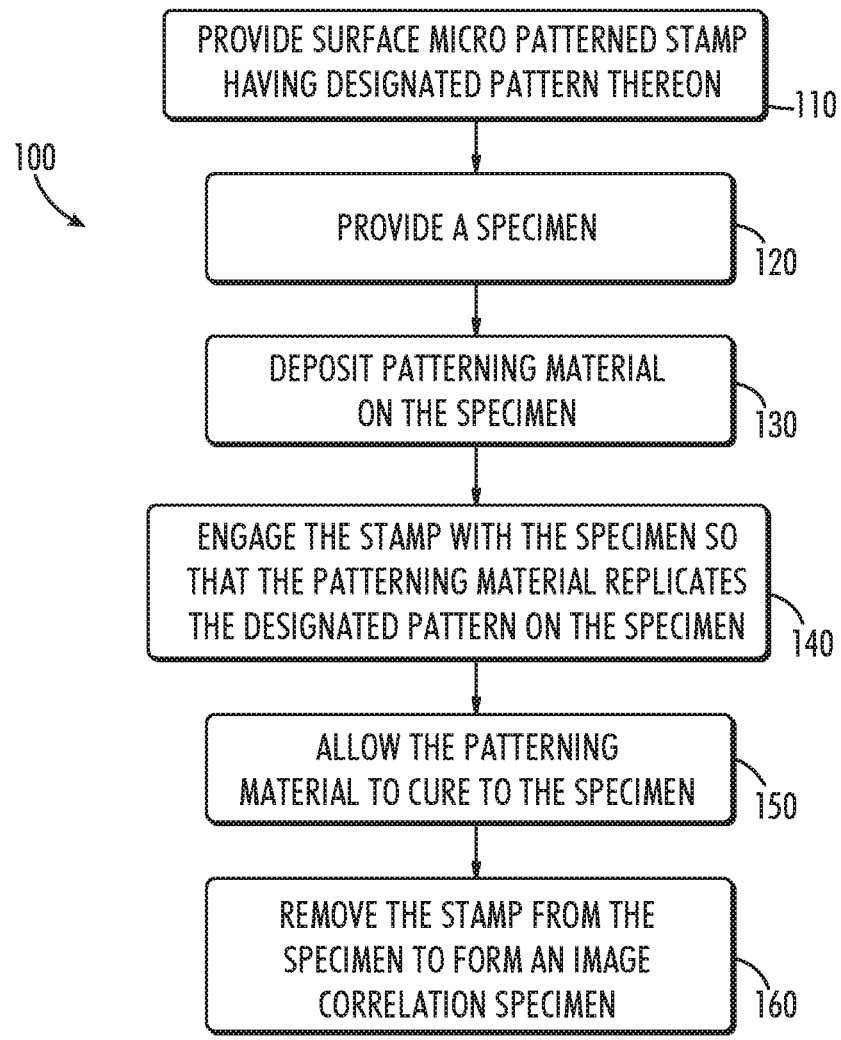

Having thus described the presently disclosed subject matter in general terms, reference will now be made to the accompanying drawings, which are not necessarily drawn to scale, and wherein:

FIG. 1 illustrates a flow diagram of an example of a method of patterning image correlation specimens of the present invention.

Figure 2:
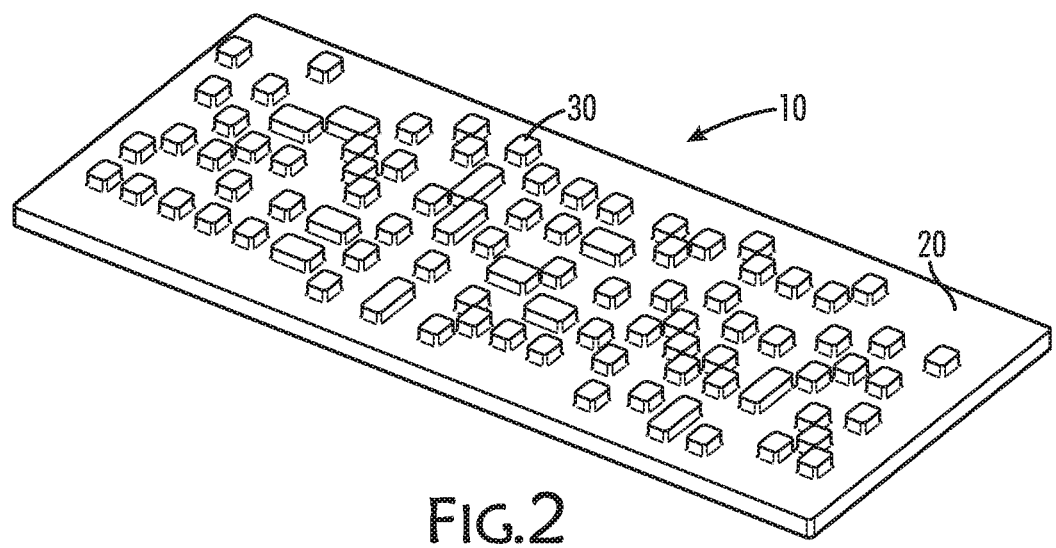

FIG. 2 illustrates a surface micro patterned stamp according to an embodiment of the present invention.

Figure 3:
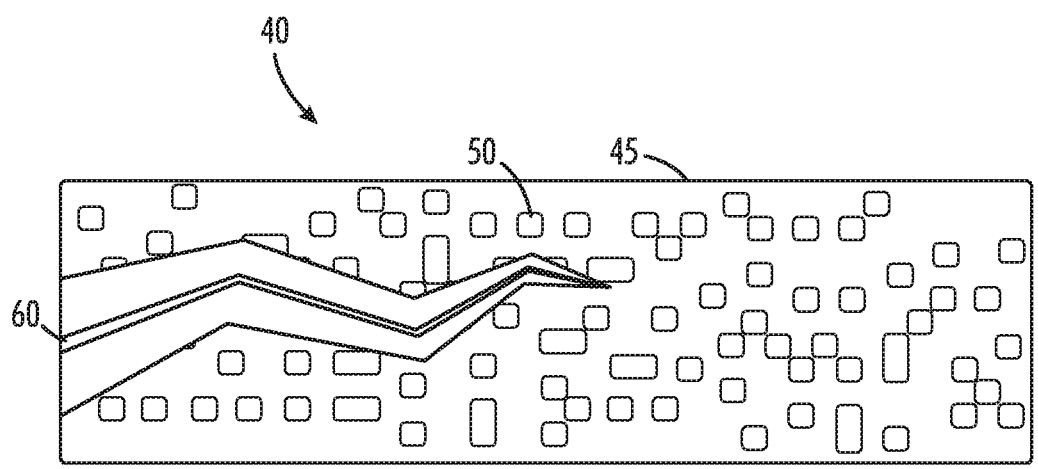

FIG. 3 illustrates a test specimen according to an embodiment of the present invention.

Figure 4:
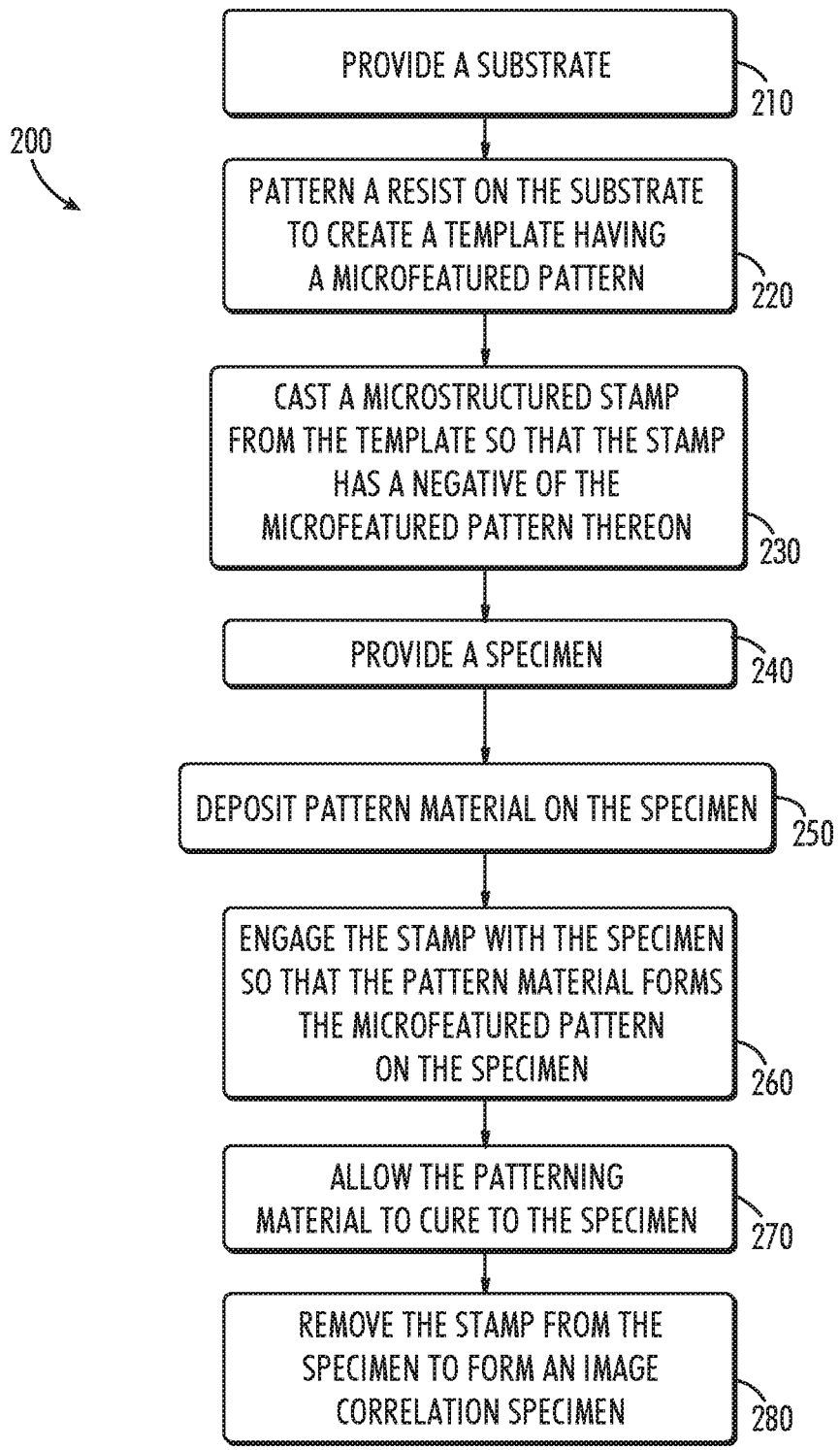

FIG. 4 illustrates a flow diagram of an example of a method of patterning image correlation specimens of the present invention.

Figure 5:
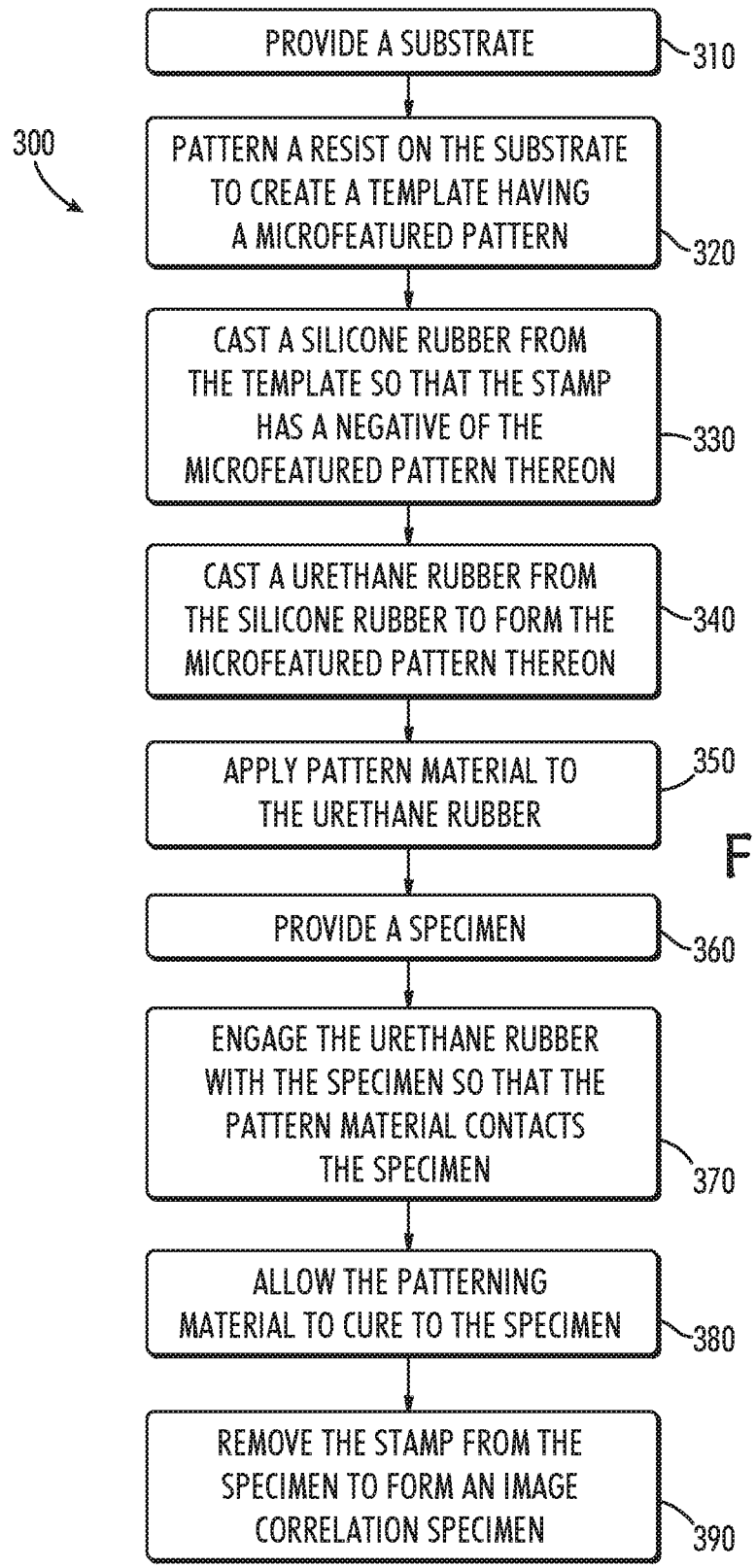

FIG. 5 illustrates a flow diagram of an example of a method of patterning image correlation specimens of the present invention.

Figure 6:
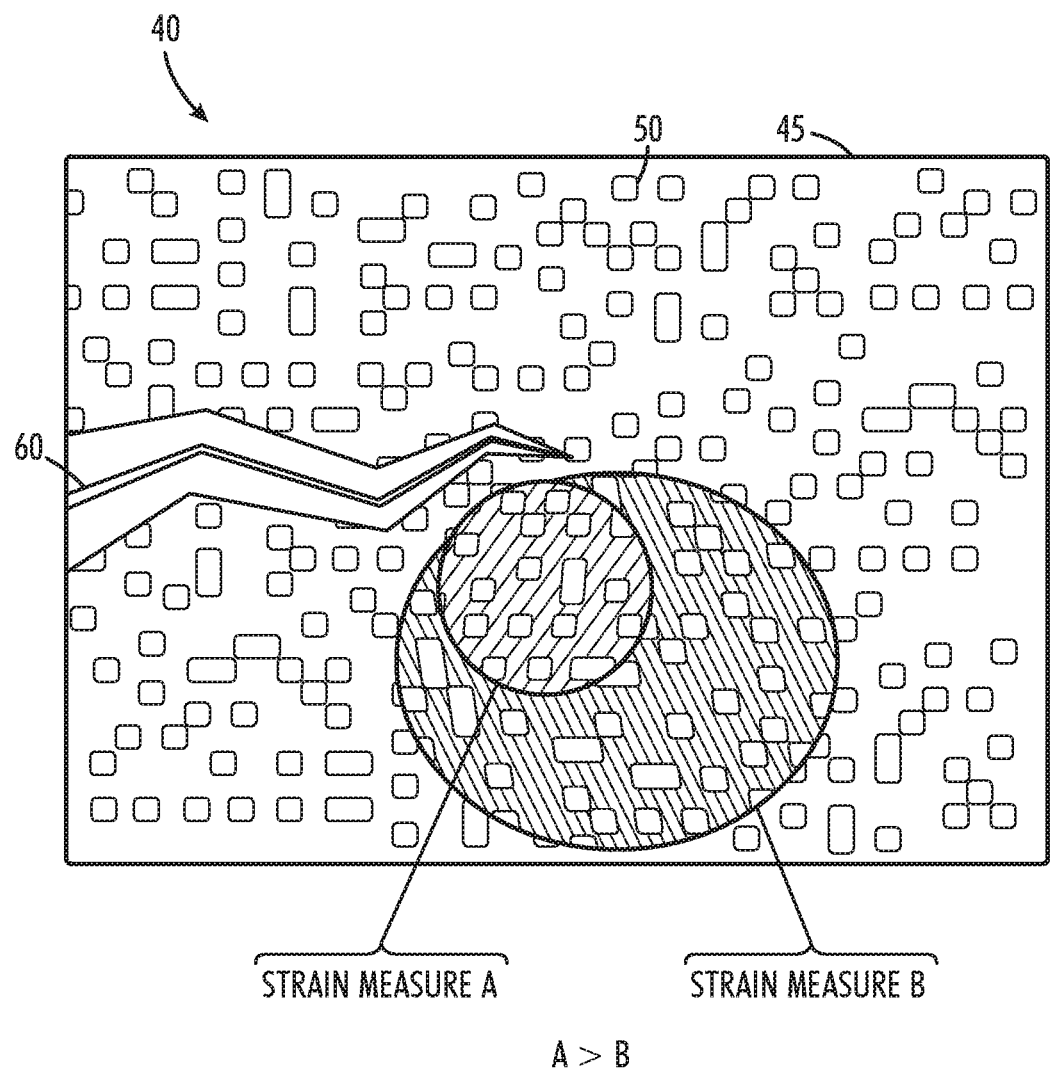

FIG. 6 illustrates a test specimen according to an embodiment of the present invention showing different strain levels within the test specimen.

DETAILED DESCRIPTION OF THE INVENTION

The present invention relates to a micro pattern stamping method and stamp device for measuring surface strain and the specimen resulting therefrom. More particularly, the present invention relates to a preferably high throughput, high-resolution, love cost, parallel patterning method in which a stamp surface pattern may be replicated into a material by mechanical contact and three dimensional material displacement or transfer printing. In summary, this method may be performed by shaping a flowable material, such as a liquid, followed by a curing process, by softening of a film by heating, or by any other kind of shaping process using the difference in hardness of a mold and a moldable material. This method may also be performed by ink transfer printing using a micro texture stamp. Preferably, the surface micro texture stamps are flexible for application to non-planar surfaces.

In general the terms and phrases used herein have their art-recognized meaning, which can be found by reference to standard texts, journal references and contexts known to those skilled in the art. The following definitions are provided to clarify their specific use in the context of the invention.

"Microstuctured object" refers to an object having a plurality of microfeatures. For example, specific microstructured objects may include microstructured prototypes, microstructured rubber stamps, and microstructured test specimens.

"Patterning material" refers to the material that is arranged into a predetermined pattern. For example, specific patterning materials may include ink, which includes, but is not limited to, photoresist, electron beam resist, paint, dyes, fluorescent dyes, pigments, and nanoparticles. Patterning materials may have high, medium, or low contrast with the substrate, and different patterning materials may have high, medium, or low contrast with each other.

"Casting" refers to a manufacturing process in which a flowable material, such as a slurry, is disposed into, onto, and/or around a mold or other primary object to preferably replicate features of the mold or primary object in the cast material. Casting methods often include a cooling or curing process to allow the cast material and/or precursor material to set and/or become solid or rigid. Some casting methods also include a final sintering, firing, or baking step to cure a "green" or not finally cured object. For some casting methods, features of the mold or primary object may be incorporated in the cast material as it sets. Further, materials such as rubber, ceramic and/or metal may be cast from molds or primary objects that are compatible with the liquid or slurry material such that the molds or primary objects do not deform, melt, and/or are not damaged when brought into contact with the liquid or slurry material.

"Molding" or "stamping" refers to a manufacturing process in which a material is shaped or forced to take a pattern using a rigid mold or other primary object. Molding methods may include placing the mold or primary object in contact with the material to be molded and applying a force to the mold, primary object, and/or material to be molded. Alternatively, the features of the mold or primary object may be replicated in the material to be molded during the molding process.

"Release agent" refers to a substance that may be applied to the surface of a mold or primary object from which a material, such as rubber may be cast to enhance and/or assist in the removal of the cast rubber from the mold or primary object. Example release agents include: napfin, paraffin wax, polysiloxanes, synthetic waxes, mineral oil, polytetrafluoroethylene (PTFE), fluorinated ethylene propylene (FEP), fluoropolymers, silanes, thiols, and combinations thereof. Some release agents may also be useful as debonding agents.

"Debonding agent" refers to a substance that may be applied to the surface of a mold or primary object from which a material is to be cast to enhance and/or assist in the removal of the cast material from the mold or primary object. Example debonding agents include: water, soap, paraffin wax, polysiloxanes, synthetic waxes, mineral oil, polytetrafluoroethylene (PTFE), fluorinated ethylene propylene (FEP), fluoropolymers, silanes, thiols, and combinations thereof. Some debonding agents may be useful as release agents.

"Flexible" refers to a property of an object when it is deformable in a reversible manner. For example, the object or material undergoes minimal or no damage, such as fracturing, breaking, or inelastically deforming when bent. Flexible polymers may be useful with the methods described herein. Example flexible polymers include, but are not limited to: rubber (including natural rubber, styrene-butadiene, polybutadiene, neoprene, ethylene-propylene, butyl, nitrile, silicones, urethanes), acrylic, nylon, polycarbonate, polyester, polyethylene, polypropylene, polystyrene, polyvinyl chloride, polyolefin, and elastomers. Flexible objects or materials of the present invention may be able to undergo strain levels selected over the range of 1% to 1300%, 10% to 1300%, or 100% to 1300% without resulting in mechanical failure (e.g., breaking, fracturing, or inelastically deforming). Further, flexible objects or materials of the present invention preferably may be able to deform to a radius of curvature selected over the range of 100 µm to 3 m without resulting in mechanical failure (e.g.; breaking, fracturing, or inelastically deforming).

"Primary object" refers to the object used in a casting or molding process from which the cast or molded object takes its shape, pattern and/or features. A primary object may refer to a prototype or master object; however, a primary object may also refer to any object from which the cast or molded object takes its shape, pattern and/or features during a casting or molding process.

"Cast object" refers to the object which is formed during a casting process. Cast objects may be made of a cured and/or cooled liquid, slurry, flowable, and/or precursor material.

"Microfeature" and "microstructures" refer to features and/or structures, on the surface of an object or mold, having an average width, depth, length and/or thickness of 100 µm or less. Further, microfeatures and microstructures of the present invention may be selected over the range of 10 nm to 100 µm, 10 nm to 10 µm, or 10 nm to 1 µm. Microfeatures and microstructures may be located on and/or within a portion of larger scale features (e.g., macro scale features) of an object. For example, microfeatures and/or microstructures may cover at least a portion of the surface area of a larger scale feature. Microfeatures and/or microstructures may include relief features. Microfeatures and/or microstructures may also or alternatively include recessed features.

"Large scale features" refer to features and/or structures that are larger than microfeatures and microstructures as defined herein.

"Macro scale features" refers to features and/or structures, on the surface of an object or mold, having an average width, depth, length and/or thickness of 100 µm or greater. For example, macro scale features may have an average width, depth, length and/or thickness of 1 mm or greater, 5 mm or greater, 1 cm or greater, 5 cm or greater or selected over the range of 100 µm to 1 m, 1 mm to 1 m, 1 cm to 1 m, or 5 cm to 1 m. Macro scale features may include relief features. Macro scale features may also or alternatively include recessed features.

"Fidelity" refers to the quality of a cast or molded object. Fidelity may also refer to the ability of features to be replicated in a cast or molded object during a casting or molding process.

"High fidelity" refers to the situation where a majority of the features of a mold or primary object are replicated in the molding or casting process to the cast or molded objects. For example, high fidelity results when 50% to 100% of the features, 75% to 100% of the features, 90% to 100% of the features, or 100% of the features are replicated on the cast or molded object.

"Replication" and "replicate" refer to features being transferred and/or recreated during the casting and/or molding processes. Replicated features preferably generally resemble the original features they are cast or molded from except that the replicated features may represent the negative of the original features.

A "negative" refers to a replication where the original features are raised features, the replicated features are recessed features and where the original features are recessed features, the replicated features are raised features. For example, micropillars in a master object may be replicated as microholes in a cast object and microholes in the master object may be replicated as micropillars in the cast object.

"Polymer" refers to a macromolecule composed of repeating structural units connected by covalent chemical bonds. Polymer may also refer to the polymerization product of one or more monomers. Polymers are often characterized by having a high molecular weight. The term polymer preferably includes homopolymers, which include polymers consisting essentially of a single repeating monomer subunit.

The term "polymer" may also include copolymers, which include polymers consisting essentially of two or more monomer subunits, such as random, block, alternating, segmented, graft, tapered and other copolymers. Example polymers useable in the present invention may be organic polymers or inorganic polymers and may be in amorphous, semi-amorphous, crystalline or partially crystalline states. Cross linked polymers having linked monomer chains are particularly useful in certain aspects and applications of the present invention. Polymers useable in the methods, devices, and device components of the present invention may include, but are not limited to, plastics, elastomers, thermoplastic elastomers, elastoplastics, thermosets, thermoplastics and acrylates. Particular polymers that may be used in the connection with the present invention include, but are not limited to, acetal polymers, biodegradable polymers, cellulosic polymers, fluoropolymers, nylons, polyacrylonitrile polymers, polyimide-imide polymers, polyimides, polyarylates, polybenzimidazole, polybutylene, polycarbonate, polyesters, polyetherimide, polyethylene, polyethylene copolymers and modified polyethylenes, polyketones, poly (ethyl methacrylate), polymethylpentene, polyphenylene oxides and polyphenylene sulfides, polyphthalamide, polypropylene, polyurethanes, styrenic resins, sulfone based resins, vinyl-based resins, rubber (including natural rubber, styrene-butadiene, polybutadiene, neoprene, ethylene-propylene, butyl, nitrile, and silicones), acrylic, nylon, polycarbonate, polypropylene, polystyrene, polyvinyl chloride, polyolefin, and combinations thereof. Particular elastomers that may be used in connection with the present invention include, but are not limited to, silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly(phenyl methyl siloxane), silicon modified elastomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene, silicones, and combinations thereof. A flexible polymer of the present invention may be a flexible elastomer.

"Digital image correlation" refers to a method that employs tracking and image registration techniques for 2D and 3D measurements of changes in images. Digital image correlation may be used to measure deformation, displacement, strain, vibration, and flow.

"Electron backscatter diffraction" (EBSD) refers to a method that allows crystallographic information to be obtained from small volumes of material in a scanning electron microscope (SEM), which preferably provides versatility in mapping orientation, crystal type, and perfection over a wide range of step sizes making it a powerful microstructural characterization tool. EBSD maps may be formed by moving a focused probe of electrons point by point across a grid of positions on the surface of a bulk sample in a scanning electron microscope. At each point, some of the electrons backscattered from the sample may be collected by a detector comprising a scintillator screen coupled generally by a lens, but sometimes by a fiber optic bundle, to a photon sensitive imaging detector, typically a charge coupled device (CCD) camera, to form an electron backscatter diffraction pattern.

The method of the present invention relates to casting and molding methods that can be applied to microstructured objects. More particularly; the method of the present invention relates to a method of patterning image correlation specimens using surface micro patterned stamps. Unless otherwise stated, the order of the steps set forth herein, such as in the specification, claims, and/or figures, are for example purposes only and are not intended to be limited by the order stated below or the order shown in the figures.

In one embodiment of the present invention, such as shown in the flow chart of FIG. 1, the method 100 of patterning image correlation specimens includes the following steps. At step 110, a surface micro patterned stamp having a designated pattern thereon, wherein the designated pattern includes microfeatures, is provided. At step 120, a specimen is provided. At step 130, a patterning material is deposited onto the specimen. At step 140, the surface micro patterned stamp is engaged with the specimen so that the patterning material replicates the designated pattern on the specimen. At step 150, the patterning material is allowed to cure. At step 160, the surface micro patterned stamp is removed from the specimen to form an image correlation specimen.

The method of the present invention may further include the step of measuring surface strain of the image correlation specimen. In an embodiment of the present invention, the method may include the step of depositing the patterning material onto the surface micro patterned stamp prior to depositing the patterning material onto the specimen and/or prior to engaging the patterning material with the specimen. In another embodiment of the present invention, the patterning material is deposited directly onto the specimen and then the surface micro patterned stamp is engaged with the specimen to displace the patterning material and replicate the designated pattern on the specimen. In an embodiment of the present invention, the patterning material is allowed to cure while the surface micro patterned stamp is engaged with the specimen. In an alternative embodiment, the surface micro patterned stamp is removed from the specimen before the patterning material has cured to the specimen and/or when the patterning material has only partially cured to the specimen. In an embodiment of the present invention, the method may include the step of applying an alternate patterning material to the specimen after the first patterning material has cured. In one embodiment, the alternate patterning material is a distinct color from the original patterning material.

In an embodiment, the patterning material may be applied directly to a specimen. When the surface micro patterned stamp engages the specimen and patterning material on the specimen, the surface micro patterned stamp may displace the pattern material deposited on the specimen. After the surface micro patterned stamp is removed from the specimen and the patterning materials sets or is cured to the specimen, a specimen suitable for image correlation testing is created. In one embodiment, the patterning material sets or cures prior to removal of the surface micro patterned stamp.

The method of the present invention may also include the step of fabricating one or more surface micro patterned stamps, such as by casting or molding techniques. In general, a casting or molding process that produces the negative of an object may be used in the present invention. Casting or molding typically incorporates a two-step process for replication of an object or features. First, a mold or form of an object may be created around or on the master object—creating a negative of the master. For a casting method, the mold or form may be filled with an end product material, creating a negative of the mold or form, which results in an end product generally resembling the master. In a molding method, the mold or form may be stamped onto the end product material and the features of the master are preferably replicated into the end product. Alternatively, the negative of the desired end product may be fabricated directly and used in a casting, molding or stamping process.

The present invention includes a surface micro patterned stamp 10 for image correlation testing. As shown in FIG. 2, the surface micro patterned stamp 10 may include a face 20, such as a rigid or flexible rubber face, having microfeatures 30 of varying shapes, such as geometric shapes, extending therefrom. The microfeatures 30 of FIG. 2 are approximately 10 microns in at least 1 dimension. As shown in FIG. 3, patterning material 50 is preferably capable of adhering to the microfeatures 30 of the stamp 10 for transferring the patterning material 50 to a surface 45 of a specimen 40 in the same pattern as provided on the stamp 10, Alternatively, the stamp may be capable of displacing patterning material. In the embodiment shown in FIG. 3, the specimen 40 includes a crack 60.

In one embodiment of the present invention, the surface micro patterned stamps are fabricated using a vacuum casting process. For example, a master may be created using lithography techniques, such as electron beam lithography, or similar replication techniques. After the master is created, a casting material for forming the surface micro patterned stamp of the present invention may be selected. The casting material may then be vacuum cast to the master so that all entrapped gas may be expelled while the casting material flows into the sub-micron features of the master. The casting material may then cure and/or polymerize preferably without bonding to the master and without shrinking, which may alter the precise micro textures to be replicated. Once the casting material is cured and/or polymerized to form a solid, it may be removed, such as by peeling, from the master and may be repeatedly used as a micro textured stamp.

The selected casting material for fabricating the stamps of the present invention is preferably conformable to the sub-micron features in the master while still allowing for clean release from the master after molding so that the master is not damaged. The casting material may be soft and/or flexible to allow for gentle peeling from the master. When flexible materials are used, the resulting stamp may also be flexible and thereby allow for pattern reproduction on curved substrates and specimens. The casting material is also preferably sufficiently durable and tough to avoid tearing at the corners of the micro textures imparted to the stamp. The casting material may be polymerized. When the casting material is polymerized, the polymerization chemistry is preferably selected to avoid bonding to the master itself.

In an embodiment of the present invention, the surface micro patterned stamp is flexible. Alternatively, the surface micro patterned stamp may be rigid. In an embodiment of the present invention, the surface micro patterned stamp may be composed of polymer material, such as silicone rubber, styrenic block copolymer (SBC) rubber, ethylene propylene diene monomer (EPDM) rubber, and/or urethane rubber. In an embodiment of the present invention, the surface micro patterned stamp is a roller shaped stamp.

In an exemplary embodiment of the method of the present invention, such as shown in the flow chart of FIG. 4, the method 200 includes the following steps. At step 210, a substrate is provided. At step 220, a resist is patterned on the substrate, such as an aluminum or silicon prototype, to create a template having a designated pattern having microfeatures on the template. In one embodiment, the resist is electron beam resist, which is patterned on the substrate using electron beam lithography to create a template having a designated pattern having microfeatures on the template. In an alternative embodiment, the resist is photoresist, which is patterned on the substrate using photolithography to create a template having a designated pattern having microfeatures on the template. At step 230, a microstructured stamp, such as a rubber stamp, is cast from the template, wherein the microstructured stamp includes a negative of the designated pattern having microfeatures. At step 240, a specimen is provided. At step 250, pattern material is deposited onto the specimen. At step 260, the microstructured stamp is engaged with the specimen so that the pattern material replicates the designated pattern having microfeatures on the specimen. At step 270, the pattern material is cured onto the specimen to form a test specimen suitable for image correlation testing. At step 280, the microstructured stamp is removed from the specimen.

In another exemplary embodiment of the method of the present invention, an image correlation specimen may be fabricated by providing a substrate and then patterning resist on a substrate to create a template having a preselected pattern on the template. In one embodiment, the substrate is an aluminum prototype. In another embodiment, the substrate is a silicon prototype. In one embodiment, the resist is electron beam resist, which is patterned on the substrate using electron beam lithography. In alternative embodiment, the resist is photoresist, which is patterned on the substrate using photolithography. A material, such as rubber, may be cast from the template to form a microstructured rubber having rubber microfeatures incorporating the preselected pattern. A pattern material, such as an opaque pattern material, may then be deposited and applied to a specimen. The microstructured rubber may then be applied to the specimen by pressing the microstructured rubber into the specimen until the pattern material has cured. Once the pattern material has preferably cured, the micro structured rubber may be released from the specimen to create a micro pattern on the specimen, which is preferably suitable for image correlation testing. When opaque pattern material is used, an opaque micro pattern may be created on the specimen.

In yet another exemplary embodiment of the method of the present invention, such as shown in the flow chart of FIG. 5, the method 300 of patterning image correlation specimens includes the following steps. At step 310, a substrate is provided. At step 320, a resist, such as electron beam resist or photoresist, is patterned onto the substrate, such as by using electron beam lithography or photolithography, to create a template having a designated pattern having microfeatures on the template. At step 330, a silicone rubber is cast from the template, wherein the silicone rubber includes a negative of the designated pattern having microfeatures. At step 340, a urethane rubber is cast from the silicone rubber, wherein the urethane rubber comprises the designated pattern having microfeatures. At step 350, pattern material, such as opaque pattern material, is applied onto the urethane rubber. At step 360, a specimen is provided. At step 370, the urethane rubber engages with the specimen so that the pattern material contacts the specimen, At step 380, the pattern material is cured onto the specimen to form a test specimen suitable for image correlation testing. At step 390, the microstructured stamp is removed from the specimen.

In yet a further exemplary embodiment of the method of the present invention, an image correlation specimen may be fabricated by first patterning resist, such as photoresist or electron beam resist, on a substrate, such as an aluminum or silicon prototype, using a method such as, photolithography or electron beam lithography, to create a template having a preselected pattern thereon. A material such as silicone rubber may then be cast from the resist to thereby fabricate a microstructured rubber comprising rubber microfeatures having the preselected pattern. Pattern material, including opaque pattern material, may be deposited to thereby make an ink pad. In this embodiment, the microstructured rubber may be treated with an oxygen plasma that preferably activates the surface of the microstructured rubber to allow for more effective ink transfer and application on the microstructured rubber from the ink reservoir. The surface activated microstructured rubber may be pressed into the ink pad so that the pattern material adheres to the surface active microstructured rubber. The surface active microstructured rubber may then be released from the ink pad to thereby create a patterned ink transfer stamp. The patterned ink transfer stamp may then be pressed onto a specimen, such as a test specimen. The patterned ink transfer stamp may be removed from the specimen, such as after the pattern material has set or cured to the specimen. After the transfer stamp is removed from the specimen, the patterned ink preferably remains on the specimen to create a micro pattern on the test specimen suitable for image correlation testing. Between microfeatures on the stamp, it is possible for no patterning material to transfer to the specimen, leaving a clean specimen surface with no patterning material immediately next to a specimen surface with patterned material. When opaque pattern material is used, an opaque micro pattern may be created on the specimen.

Also provided herein are methods for fabricating a microstructured prototype, also referred to herein as a template. The method may include the steps of providing a prototype and attaching a microstructured polymer to at least a portion of the surface of the prototype. For some embodiments, the microstructured polymer includes a preselected pattern of microfeatures. For example, the microstructured polymer may comprise a lithographically patterned flexible polymer and/or a pattern made using methods including, but not limited to micropatterning techniques such as photolithography, photoablation, laser ablation, laser patterning, laser machining, x-ray lithography, e-beam lithography, nano-imprint lithography and combinations thereof. In another embodiment, the attaching step includes flexing at least a portion of the microstructured polymer and inserting and/or attaching at least a portion of the microstructured polymer into and/or onto a macro scale feature of the prototype. In one embodiment, the flexible polymer is a flexible elastomer.

In another embodiment of the method of the present invention, a microstructured prototype may be fabricated by including one or more of the steps of providing a semiconductor wafer; patterning the semiconductor wafer with a preselected pattern of microfeatures; molding an uncured first polymer to the patterned semiconductor wafer; curing the first polymer, thereby preferably forming a microstructured flexible polymer having the preselected pattern of microfeatures; removing the microstructured flexible polymer from the patterned semiconductor wafer; providing a macro mold having one or more macro scale features; deforming at least a portion of the microstructured flexible polymer so as to conform the microstructured flexible polymer to at least a portion of the surface of the one or more macro scale features of the macro mold; providing a prototype having one or more macro scale features; depositing an uncured second polymer onto at least a portion of a surface of the one or more macro scale features of the prototype; bringing the macro mold and microstructured flexible polymer into contact with the prototype and the uncured second polymer; curing the uncured second polymer to preferably create a microstructured second polymer having the preselected pattern of microfeatures; and releasing the macro mold and microstructured flexible polymer from the prototype and microstructured second polymer.

Alternatively, the method for fabricating a microstructured prototype of the present invention may include one or more of the steps of providing a prototype and patterning the prototype with a preselected pattern of microfeatures. Example methods for patterning the prototype with a preselected pattern of microfeatures include, but are not limited to: drilling, milling, ion milling, machining, electro discharge machining, electroplating, ink jet printing, electrohydrodynamic ink jet printing, plasma etching, chemical etching, photolithography, x-ray lithography, electron beam lithography, soft lithography, embossing, stamping molding, forging, etching with a plasma, gas, or liquid, probe microscopy, atomic force microscopy, nano-indentation microscopy, chemical vapor deposition, physical vapor deposition, evaporation, electrospinning, and/or weaving microfibers or strands onto or into the surface. Other methods for patterning the prototype are contemplated herein without departing from the spirit and scope of the present invention. Further, these and other patterning methods may further be combined with the above methods, such as those utilizing polymers. For example, the polymers and/or prototype may be patterned directly using any of the above methods.

Exemplary patterning methods for semiconductor wafers include, but are not limited to photolithography, photoablation, laser ablation, laser patterning, laser machining, x-ray lithography, e-beam lithography, and/or nano-imprint lithography. Semiconductor wafer patterning methods may also include etching methods and methods useful for patterning overlayers, such as photoresist layers. As used herein, a patterned semiconductor wafer refers to a semiconductor wafer having a pattern imparted directly into the semiconductor material, a semiconductor wafer having unpatterned semiconductor material and a patterned overlayer, and/or a semiconductor wafer having patterned semiconductor material and a patterned overlayer.

In an exemplary embodiment, the microstructured prototype may include a first set of features having dimensions selected over the range of 10 nm to 100 µm and a second set of features having dimensions of 2 µm and larger. For example, the second set of features may have dimensions selected over the range of 2 µm to 100 µm. In such an embodiment, a pitch of the microfeatures may be selected over the range of 10 nm to 100 µm.

In another embodiment of the present invention, the microstructured prototype may include a plurality of micro features. For example, the microstructured prototype may have features with dimensions selected over the range of 10 nm to 100 µm. Additionally, the microstructured prototype may have one or more macro features. The macro features may have dimensions 100 µm and larger. In one embodiment, the macro features are selected over the range of 100 µm to 1 m. Optionally, at least a portion of the microfeatures are positioned on a curved surface of the microstructured prototype. In one embodiment, at least a portion of the microfeatures may be located on and/or within one or more macro scale features. In another embodiment, 80% to 100% of the surface area of the macro scale features of a microstructured prototype may be covered by the preselected pattern of microfeatures.

The features of the microstructured prototype may be replicated in the rubber with high fidelity, for example with a replication fidelity selected over the range of 50% to 100%. The method of the present invention may include the step of providing a release agent to the surface of the microstructured prototype before casting. In one embodiment, the release agent may be selected from napfin, paraffin wax, polysiloxanes, synthetic waxes, mineral oil, polytetrafluoroethylene (PTFE), fluorinated ethylene propylene (FEP), fluoropolymers, silanes, thiols, and combinations thereof. These and other release agents known to those skilled in the art may aid in separation of the cast rubber and the prototype from one another.

Furthermore, as discussed above, the microstructured prototype or template may include microfeatures having a preselected pattern. In one embodiment, the preselected pattern of microfeatures is transferred and/or replicated in a casting or molding process. In another embodiment, the preselected pattern may be transferred and/or replicated in every step of a multiple step casting and/or molding process. For example, the preselected pattern may be transferred in a rubber casting step, and/or a patterning material casting or molding or stamping step.

In an exemplary embodiment, the preselected pattern may be a regular array of microfeatures. In another embodiment, the preselected pattern may include regions where the microfeatures have a first pitch and regions where the microfeatures have a second pitch that may be greater than the first pitch. The first pitch of the present invention may be selected over the range of 10 nm to 200 µm, and the second pitch may be selected over the range of 10 nm to 1 mm. As used herein, the term pitch refers to the spacing between adjacent microfeatures.

A preselected pattern of microfeatures may include multiple dimensions of microfeatures. For example, a preselected pattern of microfeatures may include a bimodal or multimodal distribution of dimensions. In an exemplary embodiment, a preselected pattern of microfeatures may include a first group of microfeatures having dimensions selected from 10 nm to 5 µm and a second group of microfeatures having dimensions selected from 5 µm to 100 µm. The sizes, shapes and positions of the microfeatures may be preselected with micrometer-scale or nanometer-scale accuracy and/or precision. In one embodiment, each of the microfeatures in a preselected pattern may have identical dimensions. In an alternative embodiment, at least a portion of microfeatures in a preselected pattern may have dimensions that differ. In yet another alternative embodiment, at least a portion of microfeatures in a preselected pattern have height/depth:width aspect ratios selected over the range of 1:2 to 7:1.

With respect to the present invention, a microstructured object may include a plurality of microfeatures of uniform and/or varying shapes. For example the plurality of microfeatures may include, but are not limited to: holes, pillars, steps, ridges, curved regions, raised regions, recessed regions, and/or other preferably geometric shapes known to those skilled in the art of microfabrication and combinations thereof. In one embodiment of the present invention, at least a portion of the microfeatures may be positioned on a curved surface of the microstructured object. In another embodiment of the present invention, the plurality of microfeatures may have dimensions, such as height, width, and/or length, selected over the range of 10 nm to 100 µm. Example cross-sectional shapes for the microfeatures may include, but are not limited to: circles, ellipses, triangles, squares, rectangles, polygons, stars, hexagons, letters, numbers, mathematical symbols, and/or other preferably geometric shapes known to those skilled in the art of microfabrication and combinations thereof.

A microstructured object of the present invention may include one or more macro scale features. For example, such features may include, but are not limited to: channels, grooves, bumps, ridges, recessed regions, raised regions, curved regions and combinations thereof. Additional macro scale shapes and designs are contemplated without departing from the spirit and the scope of the present invention. In one embodiment, the macro scale features may have dimensions of 100 µm and larger. For example, the macro scale features may be selected over the range of 100 µm to 1 m, 1 mm to 1 m, 1 cm to 1 m, or 5 cm to 1 m.

The present invention preferably provides a measurement technique that supports a high volume of testing. Further, the present invention preferably provides a measurement technique that can be applied to various surface patterns for image correlation and thus allows for measurements on more realistic (non-planar) surfaces.

Additionally, the methods and techniques of the present invention preferably allow for highly accurate surface strain measurements and are preferably easy to implement and use. Accurate surface strain measurements using digital image correlation are often highly dependent on the application of a high-contrast pattern to the surface of the object being measured. Moreover, error in the strain measurement of the present invention may be dependent on the particular pattern applied. Thus, repeatability of the pattern on various surfaces is ideal. The techniques and methods of the present invention therefore may rely on the maximization of a correlation coefficient that is determined by examining pixel intensity array subsets on two or more corresponding images and extracting the deformation mapping function that relates the images.

The concept of contrast as used herein is wavelength specific and may be used in digital image correlation across the electromagnetic spectrum. For example, when using visible light, the pattern preferably has high optical contrast with its background material. When using electrons, such as those conducted in a scanning electron microscope, the pattern preferably has high electrical contrast with its background material. When using infrared light, the pattern preferably has high contrast within the infrared spectrum. High contrast materials can be thought of as "opaque".

Having generally described this instant disclosure, a further understanding can be obtained by reference to certain specific examples illustrated below which are provided for purposes of illustration only and are not intended to be all inclusive or limiting unless otherwise specified.

Testing & Examples

The preparation, identification, and testing of example specimens and stamps of this disclosure are further described below. The particular materials, sizes, patterns, and steps recited in these examples, as well as other conditions and details, should not be construed to unduly limit this invention.

Initial trial stamps were fabricated with a 10 micron base-element size. The stamp master was fabricated using electron beam lithography and took 57 hours to complete a ½"×½" area. Without the stamping techniques and methods of the present invention, each subsequent patterned specimen would likewise take 57 hours to complete. The trial stamps were fabricated by replicating the master pattern using the techniques disclosed herein. The pattern application took approximately 10 minutes per subsequent specimen.

After the trial stamp(s) are fabricated, the pattern may be applied to specimens, such as by following the steps set forth in FIGS. 1, 4, and/or 5 and/or other techniques disclosed herein. For example, the pattern material or "ink" may be applied to the specimen surface. Then, while the pattern material is preferably still viscous, press the micro textured stamp into the pattern material. Sufficient pressure may then be applied to shape the pattern material on the specimen so that the pattern material can cure, Curing the pattern material often requires heat and time, After curing, the stamp may be gently peeled away from the specimen to expose the pattern. The specimen is now preferably suitable for image correlation testing, and measurements, such as surface strain measurements, may be taken of the specimen.

After usage, the stamps may be maintained by cleaning with acetone, ethanol, methanol, or isopropyl alcohol (IPA) (standard lab cleaning solutions) to remove any pattern material residue from its surface. The stamps preferably do not require any special storage. It is further preferred that the stamps can be reused several times, such as about a hundred times, before potentially losing the fine detail in the pattern. Furthermore, a single trial stamp or multiple trial stamps may be fabricated from the stamp master. Moreover, the stamp master may be preserved so that additional trial stamps may be fabricated long after the initial stamps are fabricated.

The accuracy of measured strain results obtained using the methods and resulting specimens of the present invention were compared to the accuracy of measured strain results obtained when the patterns are applied using electron beam lithography. The accuracy of measured strain results obtained using the methods of the present invention were significantly better and improved.

As shown in FIG. 6, patterning material 50 forming a micro-pattern was stamped onto a mechanical test specimen's surface 45, near the tip of a crack 60. The pattern includes box-shaped features, 10 microns in size. This small pattern size allowed for the measurement of strain, through image correlation, very near the crack tip. Regions A and B in FIG. 6 illustrate two regions near the crack tip where the intensified strain, due to the presence of the crack, was measured. As expected, the strain was much higher near the crack tip, in Region A, whereas Region B contained a reduced strain level.

The significant improvements in the accuracy of the measurements of the present invention are due to several advances of the present invention over prior art techniques. For example, the methods of the present invention allow for the use of optically-opaque material in the stamping procedure, which creates a higher-contrast pattern. Electron beam lithography, in contrast, is limited to electron beam resist materials, which are not optically opaque and consequently have less contrast.

The methods of the present invention may provide for two or more patterns to be stamped onto a specimen to provide contrast for image correlation. This is particularly beneficial when multiple colors are required. For example, the use of image correlation in the blue spectrum may be preferable to provide sufficient contrast in environments that have high thermal radiation. Moreover, by stamping multiple disparate correlation patterns, each with a unique color, optimal results may be achieved by changing the observation spectrum depending on the properties of the specimen being tested, e.g. heats or cools. Furthermore, multiple materials may be used to constitute the correlation pattern where multiple colors alone are not sufficient for providing contrast outside the visible spectrum, such as in electron beam imaging discussed above. Furthermore, the stamping of multiple materials may also be used in multiscale observations where micro and macro image correlation are being employed simultaneously. In such cases, a pattern with microscale speckles and another with microscale speckles may be stamped onto the same region of a specimen.

It is contemplated that roller stamping tools may be used in connection with the present invention. Roller stamping tools may be particularly beneficial for patterning specimens of arbitrary size.

The stamping procedure for image correlation of the present invention preferably mitigates the need for dedicated technical staff and special infrastructure, allows specimens to be patterned in a few minutes rather than days, and creates patterns that can be applied to complex surface geometries and larger surface areas. The stamping procedure of the present invention preferably utilizes high contrast materials, in comparison with electron beam lithography, that often improve measurement results. Identical stamps may be fabricated and may serve as a standard basis for the research community. Further, the specimens produced often require significantly less surface preparation time than other known methods.

STATEMENTS REGARDING INCORPORATION BY REFERENCE AND VARIATIONS

All references throughout this application, for example patent documents including issued or granted patents or equivalents, patent application publications, and non-patent literature documents are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Every formulation or combination of components described or exemplified herein may be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

The terms and expressions which have been employed are used as terms of description and not of limitation, and there is no intention in the use of such terms and expressions of excluding any equivalents of the features shown and described or portions thereof. It is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art and that such modifications and variations are considered to be within the scope of this invention as defined by the appended claims. For example, the method steps of the present invention are set forth for exemplary purposes in a particular order; however, unless expressly stated otherwise, the order of the method steps set forth herein are not intended to be limited by the order set forth in the specification, figures, or claims,

We claim:

1. A method of patterning image correlation specimens comprising the steps of:
    providing a surface micro patterned stamp having a designated pattern thereon, wherein the designated pattern includes microfeatures;
    providing a specimen;
    depositing a patterning material onto the specimen;
    engaging the surface micro patterned stamp with the specimen so that the patterning material replicates the designated pattern on the specimen, wherein patterning material is consistently not transferred onto the specimen between microfeatures of the designated pattern of the surface micro patterned stamp;
    allowing the patterning material to cure;
    removing the surface micro patterned stamp from the specimen to form an image correlation specimen; and
    measuring surface strain of the image correlation specimen.

2. The method of claim 1 further comprising the step of depositing the patterning material onto the surface micro patterned stamp prior to depositing the patterning material onto the specimen.

3. The method of claim 1 further comprising the step of applying an alternate patterning material to the specimen after the first patterning material has cured.

4. The method of claim 3 wherein the alternate patterning material is a distinct color from patterning material.

5. The method of claim 1 further comprising the step of fabricating a surface micro patterned stamp.

6. The method of claim 5 wherein the surface micro patterned stamp is fabricated by casting or molding the surface micro patterned stamp from a stamp master.

7. The method of claim 6 further comprising the step of patterning electron beam resist on a prototype using electron beam lithography to fabricate the stamp master.

8. The method of claim 1 wherein the surface micro patterned stamp is flexible.

9. The method of claim 1 wherein the surface micro patterned stamp is a roller shaped stamp.

10. The method of claim 1 wherein the surface micro patterned stamp is composed of a polymer material.

11. The method of claim 10 wherein the polymer material is selected from the group consisting of silicone rubber, styrenic block copolymer rubber, ethylene propylene diene monomer rubber, and urethane rubber.

12. The method of claim 1 wherein the specimen is curved.

13. The method of claim 1 wherein the specimen is flat.

14. The method of claim 1 wherein the patterning material is opaque.

15. The method of claim 1 wherein the patterning material is transparent.

16. The method of claim 1 wherein the patterning material is ink.

17. The method of claim 16 wherein the ink is selected from the group consisting of photoresist, electron beam resist, paint, and dye.

18. A method of patterning image correlation specimens comprising the steps of:
    providing a substrate;
    patterning a resist on the substrate to create a template having a designated pattern having microfeatures on the template;
    casting a microstructured stamp from the template, wherein the microstructured stamp comprises a negative of the designated pattern having microfeatures;
    providing a specimen;
    depositing pattern material onto the specimen;
    engaging the microstructured stamp with the specimen so that the pattern material forms the designated pattern having microfeatures on the specimen and wherein pattern material is consistently not transferred onto the specimen between microfeatures of the designated pattern;
    curing the pattern material onto the specimen to form a test specimen suitable for image correlation testing;
    removing the microstructured stamp from the specimen; and
    measuring surface strain of the image correlation specimen.

19. The method of claim 18 wherein the stamp is composed of rubber.

20. The method of claim 19 wherein the rubber is silicone rubber.

21. The method of claim 20 further comprising the step of treating the microstructured stamp with an oxygen plasma.

22. The method of claim 18 wherein the substrate is selected from an aluminum prototype or a silicon prototype.

23. The method of claim 18 wherein the resist is electron beam resist that is patterned on the substrate using electron beam lithography.

24. The method of claim 18 wherein the resist is photoresist that is patterned on the substrate using photolithography.

25. The method of claim 18 further comprising the step of depositing the pattern material on the microstructured stamp prior to depositing the pattern material onto the specimen.

26. The method of claim 18 wherein the pattern material is opaque and the designated pattern having microfeatures formed on the specimen is an opaque micro pattern.

27. A method of patterning image correlation specimens comprising the steps of:
    providing a substrate;
    patterning a resist on the substrate to create a template having a designated pattern having microfeatures;
    casting a silicone rubber from the template, wherein the silicone rubber comprises a negative of the designated pattern having microfeatures;
    casting a urethane rubber from the silicone rubber, wherein the urethane rubber comprises the designated pattern having microfeatures;
    applying pattern material onto the urethane rubber;
    providing a specimen;
    engaging the urethane rubber with the specimen so that the pattern material contacts the specimen, wherein pattern material is consistently not transferred onto the specimen between microfeatures of the designated pattern of the urethane rubber;
    curing the pattern material onto the specimen to form a test specimen suitable for image correlation testing;
    removing the microstructured stamp from the specimen; and
    measuring surface strain of the image correlation specimen.

28. The method of claim 27 wherein the pattern material is opaque and the designated pattern having microfeatures formed on the specimen is an opaque micro pattern.

* * * * *